United States Patent
Otsubo

(10) Patent No.: US 10,714,896 B2
(45) Date of Patent: Jul. 14, 2020

(54) MULTI-WAVELENGTH LIGHT SOURCE AND OPTICAL MODULE USING THE SAME

(71) Applicant: Fujitsu Optical Components Limited, Kawasaki-shi, Kanagawa (JP)

(72) Inventor: Koji Otsubo, Yokohama (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 16/390,572

(22) Filed: Apr. 22, 2019

(65) Prior Publication Data
US 2019/0348810 A1    Nov. 14, 2019

(30) Foreign Application Priority Data
May 10, 2018   (JP) ................. 2018-091665

(51) Int. Cl.
*H01S 5/00*    (2006.01)
*H01S 5/10*    (2006.01)
*H01S 5/14*    (2006.01)
*H01S 5/125*   (2006.01)
*H01S 5/50*    (2006.01)

(52) U.S. Cl.
CPC ............ *H01S 5/1092* (2013.01); *H01S 5/125* (2013.01); *H01S 5/141* (2013.01); *H01S 5/50* (2013.01); *H01S 5/14* (2013.01)

(58) Field of Classification Search
CPC .......... H01S 5/1092; H01S 5/50; H01S 5/125; H01S 5/141; H01S 5/14
See application file for complete search history.

(56) References Cited

U.S. PATENT DOCUMENTS 5,428,635 A * 6/1995 Zhiglinsky ........ H01S 3/094034
                                                    372/102
5,805,755 A * 9/1998 Amersfoort ........ G02B 6/12004
                                                    372/46.012

(Continued)

FOREIGN PATENT DOCUMENTS

| JP | 2003-508925 | 3/2003 |
| JP | 2008-227010 | 9/2008 |
| JP | 2016-213379 | 12/2016 |

OTHER PUBLICATIONS

English abstract for International Publication No. WO 01/17073 A1 corresponding to Japanese Patent Publication No. 2003-508925, published Mar. 4, 2003.

(Continued)

*Primary Examiner* — Kinam Park
(74) *Attorney, Agent, or Firm* — Staas & Halsey LLP

(57) ABSTRACT

A multi-wavelength light source has a laser region that includes a gain medium with a reflective end facet and two or more diffraction gratings optically connected to a second end facet opposite to the reflective end facet of the gain medium, an optical amplifier configured to amplify a laser beam emitted from the reflecting end facet of the laser region and containing multiple wavelengths, the multiple wavelengths being amplified collectively, an optical demultiplexer configured to demultiplex an amplified laser beam output from the optical amplifier, and output waveguides connected to the optical demultiplexer and configured to output light beams with the multiple wavelengths.

17 Claims, 9 Drawing Sheets

(56) References Cited

U.S. PATENT DOCUMENTS

| | | | | |
|---|---|---|---|---|
| 6,434,175 B1* | 8/2002 | Zah | ............ | H01S 3/2383 |
| | | | | 372/20 |
| 2003/0095737 A1* | 5/2003 | Welch | ............ | B82Y 20/00 |
| | | | | 385/14 |
| 2015/0236809 A1* | 8/2015 | Dong | ............ | H04J 14/02 |
| | | | | 398/79 |
| 2016/0336718 A1* | 11/2016 | Takabayashi | ......... | H01S 5/0612 |

OTHER PUBLICATIONS

Patent Abstracts of Japan English abstract for Japanese Patent Publication No. 2016-213379, published Dec. 15, 2016.
Patent Abstracts of Japan English abstract for Japanese Patent Publication No. 2008-227010, published Sep. 25, 2008.

\* cited by examiner $\sin \alpha = n \cdot \sin \beta$
n : INDEX OF REFRACTION OF GAIN WAVEGUIDE

MULTI-WAVELENGTH LIGHT SOURCE AND OPTICAL MODULE USING THE SAME

CROSS-REFERENCE TO RELATED APPLICATIONS

This application is based upon and claims priority to earlier filed Japanese Patent Application No. 2018-091665 filed May 10, 2018, which is incorporated herein by reference in its entirety.

FIELD

The present invention relates to a multi-wavelength light source and an optical module using the same.

BACKGROUND

In the field of optical communications, wavelength division multiplexing (WDM) is employed as a solution of transmitting a large amount of data, in which optical carrier signals of multiple wavelengths are multiplexed in and transmitted by an optical fiber. The 100 Gbps Ethernet (100 GE) of fiber-optic telecommunication standard uses four-wavelength WDM that transmits optical signals with a data rate of 4×25.8 Gbps. In recent years, standardization for transmission capacity over 100 GE has been in progress. One example is 400 Gbps Ethernet (400 GE), which uses a 4-level pulse amplitude modulation (PAM-4) WDM that transmits optical signals using four wavelengths with a data rate of 4×56 Gbaud.

Downsizing and energy saving of WDM optical transceivers are also in progress. For a transmitter optical sub-assembly (TOSA) mounted in a WDM optical transceiver, a technology for densely mounting a plurality of laser diodes (LDs) and collimating lenses, and a technology for downsizing an optical multiplexer/demultiplexer, and other technologies are being developed. With the rise of silicon photonics in recent years, further downsizing and cost reduction are being achieved.

In silicon photonics, the components other than LD, such as an optical modulator, a modulator-driver integrated circuit (IC), optical multiplexers/demultiplexers, photodiodes (PD) for monitoring the output power, etc. are fabricated in a silicon substrate, and the LD is hybrid-integrated onto the substrate. Because an LD cannot be fabricated of an indirect bandgap material such as silicon, it is made of a compound semiconductor with a direct bandgap and mounted on a silicon photonics substrate.

Some multi-wavelength lasers have been proposed for WDM telecommunications. See, for example, Patent Documents 1 and 2 listed below. There is a demand for a multi-wavelength light source with less power consumption, while preventing the throughput yield from decreasing.

PRIOR ART DOCUMENTS

Patent Document 1: Japanese unexamined patent publication (Translation of PCT application) No. 2003-508925
Patent Document 2: U.S. Patent Application Publication No. 2015/0236809

SUMMARY

According to one aspect of the invention, a multi-wavelength light source has a laser region that includes a gain medium with a reflective end facet, and two or more diffraction gratings optically connected to a second end facet opposite to the reflective end facet of the gain medium, an optical amplifier configured to amplify a laser beam emitted from the reflecting end facet of the laser region and containing multiple wavelengths, the multiple wavelengths being amplified collectively, an optical demultiplexer configured to demultiplex an amplified laser beam output from the optical amplifier, and output waveguides connected to the optical demultiplexer and configured to output light beams with the multiple wavelengths.

The object and advantages of the invention will be realized and attained by means of the elements and combinations particularly pointed out in the claims. It is to be understood that both the foregoing general description and the following detailed description are exemplary and explanatory and are not restrictive to the invention as claimed.

DESCRIPTION OF EMBODIMENTS

Figure 1:
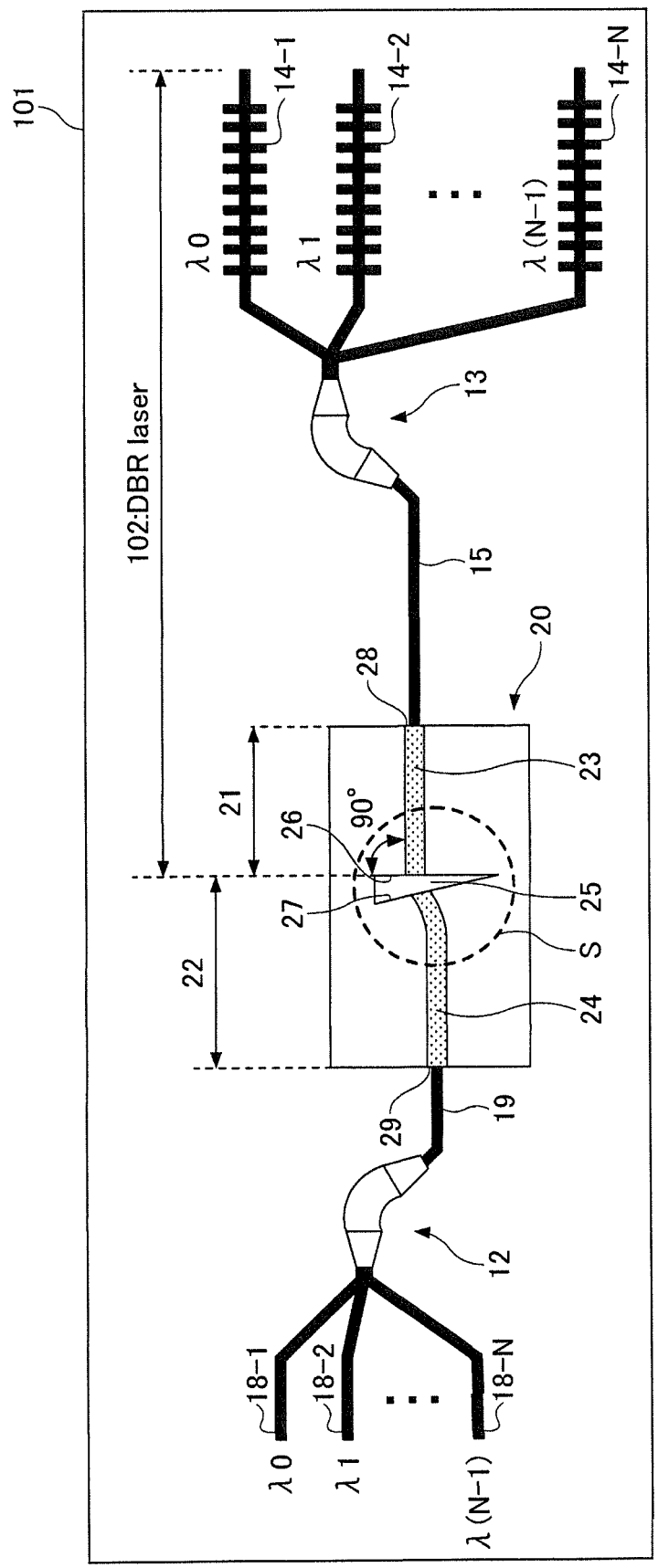
FIG. 1 is a schematic diagram of a multi-wavelength light source according to a first embodiment.

In manufacturing a LD for WDM, even one wavelength deviating from the design will affect the throughput yield of the entirety of a TOSA, and therefore, it is necessary to precisely control the dimensions of the diffraction gratings, the structure and compositions of the active layer, and so on. When mounting a LD onto a silicon photonics substrate, optical loss of the device generally exceeds 10 dB, and it is required for the LD to produce a high-power beam to compensate for the loss. In order to meet with the high-power output requirement, a large quantity of electrical current has to be injected into the LD chip for the multiple wavelengths, which may be disadvantageous in terms of reducing the power consumption.

In the conventional multi-wavelength laser light sources, a diffraction grating or a reflecting mirror is provided externally in order to suppress variations in the manufacturing process or to maintain the throughput yield of LDs, and the role of a compound semiconductor chip is focused on a gain chip for generating gain. In the conventional configurations, one gain medium is provided per wavelength, and electric currents covering the number of wavelengths are injected into the corresponding number of gain chips. This is disadvantageous in terms of reducing the power consumption.

In embodiments, instead of using as many LD chips as the number of wavelengths, a single laser gain medium is used to provide a multi-wavelength laser that can emit light beams of multiple wavelengths. This is achieved by forming a resonator using a laser gain medium and as many diffraction gratings or mirrors (hereinafter, simply referred to as "diffraction gratings") as the number of wavelengths.

The diffraction gratings are provided in parallel, and the respective diffraction gratings are connected to the laser gain medium by an optical multiplexer/demultiplexer. A resonator having a free spectral range (FSR) equal to the wavelength spacing of the diffraction gratings may be provided between the laser gain medium and the optical multiplexer/demultiplexer. The laser beam output from the resonator as the multi-wavelength light source contains multiple wavelengths, which are amplified collectively by an optical amplifier. The amplified laser beam is demultiplexed by an optical demultiplexer and light beams of the respective wavelengths are finally emitted.

The optical amplifier is, for example, a semiconductor optical amplifier (SOA). Since this SOA is used for boosting, it may be called a "booster SOA." The laser beam boosted by the SOA is a continuous wave (CW) containing a plurality of wavelengths.

The emission-side end facet of the laser gain medium and the incident-side end facet of the booster SOA are not parallel to each other, and one is tilted from a plane parallel to the other. In the laser gain medium, the emission-side end facet is set perpendicular to the optical axis of the gain waveguide to efficiently cause resonance for laser oscillation. The booster SOA has the end facet on the incident side that tilts from a plane perpendicular to the optical axis of the laser beam emitted from the laser gain medium. This configuration prevents a light component reflected from the incident-side end facet of the booster SOA from re-entering the gain waveguide of the laser gain medium.

By generating multi-wavelength laser beam using a single laser gain medium and a plurality of external diffraction gratings, influence of variations in the LD manufacturing process is reduced, and power consumption in the gain medium is also reduced. By amplifying the laser beam containing multiple wavelengths collectively using one booster SOA, optical loss that may arise at optical components such as an optical modular or optical multiplexers/demultiplexers provided in the subsequent stage of the multi-wavelength light source can be compensated for in advance.

First Embodiment

FIG. 1 is a schematic diagram of a multi-wavelength light source 10A of the first embodiment.

In the first embodiment, one laser gain medium and one optical amplifier are formed on the same chip or substrate 20. Although both the laser gain medium and the optical amplifier are media that generate optical gain, in the following embodiments, the laser gain medium is referred to as a "gain chip" and the optical amplifier is referred to as a "booster SOA".

The substrate 20 in which a gain chip 21 and a booster SOA 22 are formed is mounted on another substrate 101, and it is optically connected to the optical waveguide circuit formed on the substrate 101. The substrate 101 is, for example, a silicon-on-insulator (SOI) wafer, which may be called a silicon photonics wafer in which optical waveguides and optical components are fabricated by silicon photonic wires.

In the example of FIG. 1, an optical waveguide 15 connected to the gain chip 21, a plurality of diffraction gratings 14-1 to 14-N (which may be referred to collectively as "diffraction gratings 14") arranged in parallel, and an optical multiplexer/demultiplexer 13 for connecting the optical waveguide 15 and the respective diffraction gratings 14 are formed on the substrate 101.

On the substrate 101 are also formed an optical waveguide 19 connected to the booster SOA 22, an optical demultiplexer 12, and a plurality of output waveguides 18-1 to 18-N (which may be referred to collectively as "output waveguides 18").

The gain waveguide 23 of the gain chip 21 is optically coupled to the optical waveguide 15 formed on the substrate 101, and the gain waveguide 24 of the booster SOA 22 is optically coupled to the optical waveguide 19 formed on the substrate 101.

The substrate 20 has a separating section S, in which the gain chip 21 and the booster SOA 22 are separated by a separation groove 25. The separation groove 25 is formed, for example, by etching the substrate 20 in which a gain waveguide of a predetermined pattern is fabricated in advance, and removing a portion of the substrate 20 from the top surface to a predetermined depth. By the separation groove 25, the substrate 20 is divided into the gain chip 21 with the gain waveguide 23 and the booster SOA 22 with the gain waveguide 24.

The separation groove 25 has an inner wall that becomes an end facet 26 of the gain chip 21 and another inner wall that becomes an end facet 27 of the booster SOA 22. When the separation groove 25 is formed by dry etching, both the end facet 26 and the end facet 27 become reflective surfaces and serve as etched mirrors. The end facet 26 of the gain chip 21 is within a plane perpendicular to the optical axis of the gain waveguide 23. The end facet 27 of the booster SOA 22 is tilted from a plane perpendicular to the incident light from the gain waveguide 23.

A wedge-shaped space is formed between the end facet 26 and the end facet 27 by the separation groove 25, which provides an air layer. Although not illustrated, individual electrodes are provided for current injection to the gain chip 21 and the booster SOA 22 separated by the separation groove 25, and the injection currents are controlled independently of each other.

A distributed Bragg reflector (DBR) laser region 102 is formed by the gain chip 21 and a plurality of diffraction gratings 14-1 to 14-N. The light generated by the gain chip 21 is filtered or demultiplexed by the optical multiplexer/demultiplexer 13. The optical multiplexer/demultiplexer 13 may be an arrayed waveguide grating (AWG), an optical filter using Mach Zehnder (MZ) interferometers, or the like.

The demultiplexed light components are diffracted and strengthened at specific wavelengths determined by the periodic structures of the diffraction gratings 14-1 to 14-N, and are fed back to the gain chip 21. The end facet 26 of the gain chip 21 facing the inner space of the separation groove 25 is a reflective surface, and the opposite end facet 28 adjacent to the optical waveguide 15 is an anti-reflective surface. Lights reciprocate between the end facet 26 of the gain chip 21 and the respective diffraction gratings 14, and laser oscillation occurs at a wavelength determined by each of the diffraction gratings 14. A portion of the laser light including a plurality of wavelengths is output from the end facet 26, amplified by the booster SOA 22, and demultiplexed by the optical demultiplexer 12.

Figure 2:
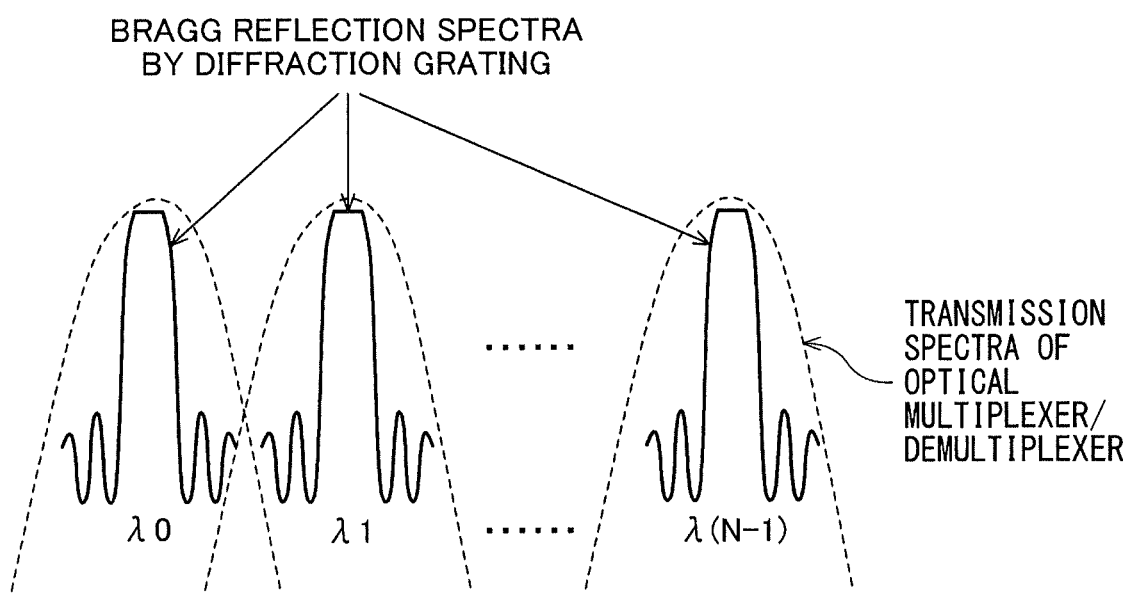
FIG. 2 illustrates Bragg reflection spectra of respective diffraction gratings and transmission spectra of optical multiplexer/demultiplexer.

FIG. 2 illustrates Bragg reflection spectra by the respective diffraction gratings 14 and transmission spectra of the optical multiplexer/demultiplexer 13. The optical multiplexer/demultiplexer 13 has periodic transmission spectra illustrated by dashed lines. Each of the diffraction gratings 14-1 to 14-N has a Bragg reflection spectrum determined by its periodic structure. The Bragg reflection spectra of the respective diffraction gratings 14 overlap associated transmission spectra of the optical multiplexer/demultiplexer 13 to cause laser oscillations at wavelengths $\lambda_0, \lambda_1, \ldots \lambda_{N-1}$. The laser beam containing the respective wavelengths is emitted from the end facet 26 of the gain chip 21.

Figure 3:
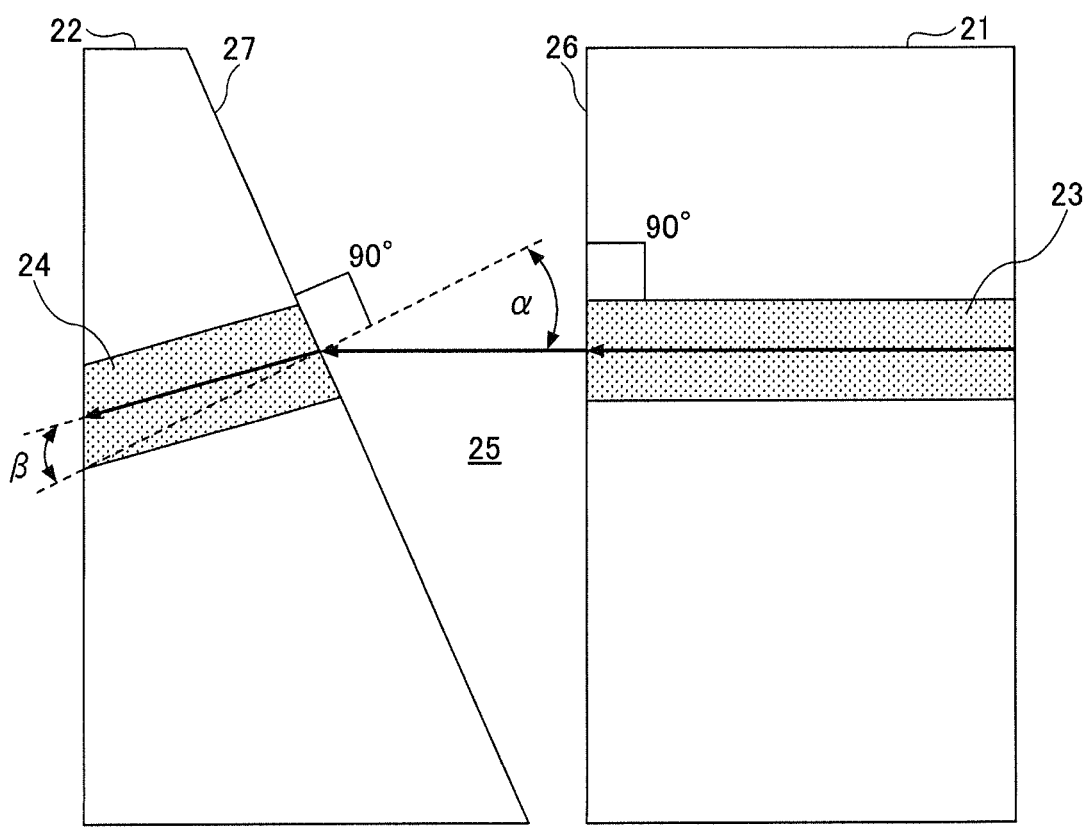
FIG. 3 is an enlarged view of the separation between the gain chip and the booster SOA of FIG. 1.

FIG. 3 is an enlarged view of the separating section S that separates the gain chip 21 and the booster SOA 22. The end facet 26 of the gain chip 21 is within a plane perpendicular to the optical axis of the gain waveguide 23. The laser beam emitted from the gain waveguide 23 travels straight through the air layer of the separation groove 25 and is incident on the end facet 27 of the gain waveguide 24 of the booster SOA 22.

The end facet 27 of the booster SOA 22 is positioned tilted with respect to the incident beam. Assuming that the incident angle of the laser beam onto the end facet 27 is $\alpha$ and that the refraction angle from air to the gain waveguide 24 is $\beta$, $\sin(\alpha)=n\times\sin(\beta)$ stands from the Snell's law, where "n" denotes the index of refraction of the gain waveguide 24 relative to the air.

By forming the separation groove 25 with the configuration of FIG. 3 in the separating section S, the reflective facets (i.e., the etched mirrors) are provided to the gain chip 21 and the booster SOA 22, while preventing resonance from occurring in the separating section S. The laser beam incident on and partially reflected from the end facet 27 of the booster SOA 22 is prevented from re-entering the gain waveguide 23 of the gain chip 21.

The substrate 20 on which the gain chip 21 and the booster SOA 22 are fabricated is made of a compound semiconductor. The gain waveguide 23 and the gain waveguide 24 are formed of, for example, multilayers of InGaAsP quantum wells or quantum dots for C-band telecommunication.

The substrate 20 is embedded in, for example, a groove or a recess formed in a substrate 101 which may be a silicon photonics wafer. The substrate 20 is placed such that the optical waveguide 15 of the substrate 101, the gain waveguide 23 of the gain chip 21, the gain waveguide 24 of the booster SOA 22, and the optical waveguide 19 of the substrate 101 are all aligned at the same position in the thickness (or layered) direction. The light emitted from the end facet 29 on the emission side of the booster SOA 22 travels through the optical waveguide 19 and enters the optical demultiplexer 12 at which the incident light is demultiplexed into the respective wavelengths. The demultiplexed light beams with the respective wavelengths are output from the output waveguides 18-1 to 18-N.

With this configuration, a multi-wavelength laser beam can be generated using a single laser gain medium and a single optical amplifier, and a compact multi-wavelength light source with less power consumption is achieved. In addition, decrease of the throughput yield due to manufacturing variations of LDs can be avoided.

Second Embodiment

Figure 4:
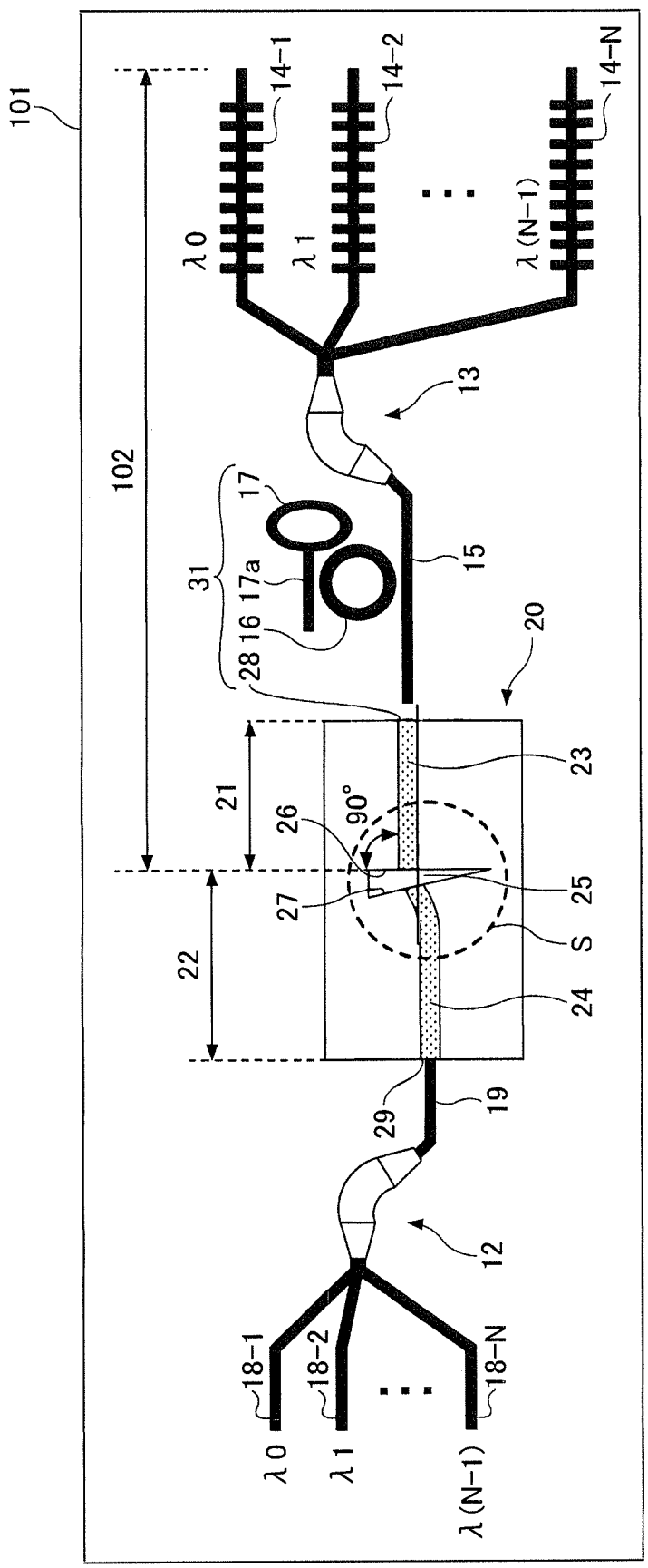
FIG. 4 is a schematic diagram of a multi-wavelength light source according to a second embodiment.

FIG. 4 is a schematic diagram of a multi-wavelength light source 10B according to the second embodiment. In the second embodiment, a resonator 31 having a predetermined free spectral range (FSR) is provided between the gain chip 21 and the optical multiplexer/demultiplexer 13. The other configuration is the same as that of the first embodiment. The same components as those of the first embodiment are denoted by the same reference numerals and redundant description will be omitted.

The gain chip 21 and the booster SOA 22 formed in the same substrate 20 are separated from each other by the separation groove 25 of the separating section S. The end facet 26 of the gain chip 21 and the end facet 27 of the booster SOA 22, which are slightly tilted from each other from the parallel position, serve as etched mirrors. Optical resonators are formed between the end facet 26 of the gain chip 21 and the respective diffraction gratings 14-1 to 14-N in the laser region 102, in which laser oscillations occur at wavelengths determined by the periodic structures of the respective diffraction gratings 14.

One of features of the second embodiment is that a ring waveguide 16 and a loop mirror 17 are provided along the optical waveguide 15 between the gain chip 21 and the optical multiplexer/demultiplexer 13. A resonator 31 is configured between the loop mirror 17 and the end facet 28 of the gain chip 21 that is coupled to the optical waveguide 15. The light coupled from the optical waveguide 15 to the ring waveguide 16 travels around the ring and at a certain point of time, the light is coupled to the linear waveguide 17a and reflected back from the loop mirror 17. The reflected light travels through the reverse path and is reflected again from the end facet 28 of the gain waveguide 23, reciprocating between the loop mirror 17 and the end facet 28.

The resonator 31 has a FSR determined by the resonance of the resonator 31. The resonator 31 is formed such that the FSR is equal to the wavelength spacing determined by the diffraction gratings 14-1 to 14-N. Assuming that the resonator length of the resonator 31 is L and the speed of light propagating through the core of the optical waveguide is c, FSR is expressed by 2L/c. The resonator 31 is designed such that 2L/c is substantially equal to the wavelength spacing of the diffraction gratings 14-1 to 14-N.

Figure 5:
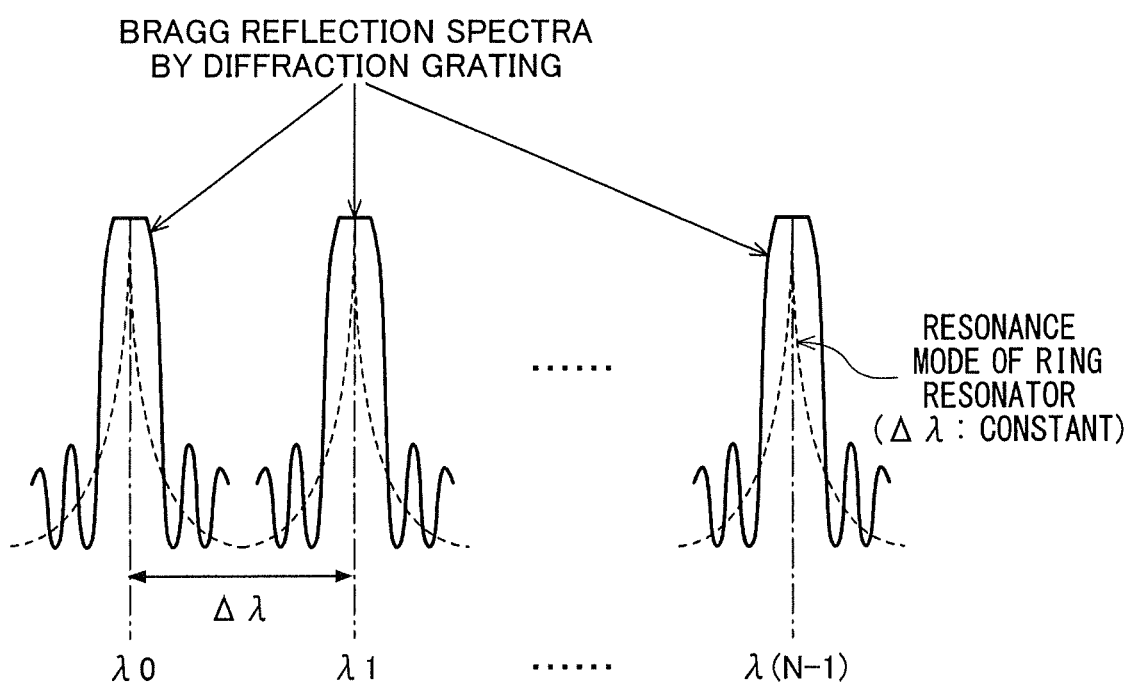
FIG. 5 illustrates Bragg reflection spectra of the diffraction gratings and resonant modes of a ring resonator.

FIG. 5 illustrates Bragg reflection spectra of the respective diffraction gratings 14 and resonator modes of the resonator 31. The FSR determined by the resonance of the resonator 31 is made consistent with the wavelength spacing $\Delta\lambda$ of the WDM. Besides, the diffraction gratings 14-1 to 14-N are fabricated such that the Bragg wavelengths for laser oscillation are consistent with the WDM channel wavelengths.

With this configuration, the spacing of the multiple wavelengths to be multiplexed is determined by the FSR of the resonator 31, and accordingly, the wavelength spacing becomes even. In the first embodiment, as illustrated in FIG. 2, the spectra of the lights filtered by the optical multiplexer/demultiplexer 13 are slightly broader than the spectra illustrated in FIG. 5. Even though the oscillation wavelengths are within the corresponding envelopes of FIG. 2, the wavelength spacing is not always even. It contrast, in the second embodiment, the wavelength spacing can be precisely controlled by the FSR.

The laser beam containing a plurality of wavelengths at even intervals is amplified collectively by the booster SOA 22. The amplified laser beam is demultiplexed into the respective wavelengths by the optical demultiplexer 12, and output from the output waveguides 18-1 to 18-N. Because of the laser beam containing the multiple wavelengths and amplified collectively, optical loss that may arise in the optical modulator or the optical multiplexer provided at the subsequent stage after the multi-wavelength light source 10B is compensated for in advance.

Again in the second embodiment, a multi-wavelength laser beam is generated using a single laser gain medium. Decrease in the throughput yield is suppressed, and a compact multi-wavelength light source with less power consumption is achieved.

Third Embodiment

Figure 6:
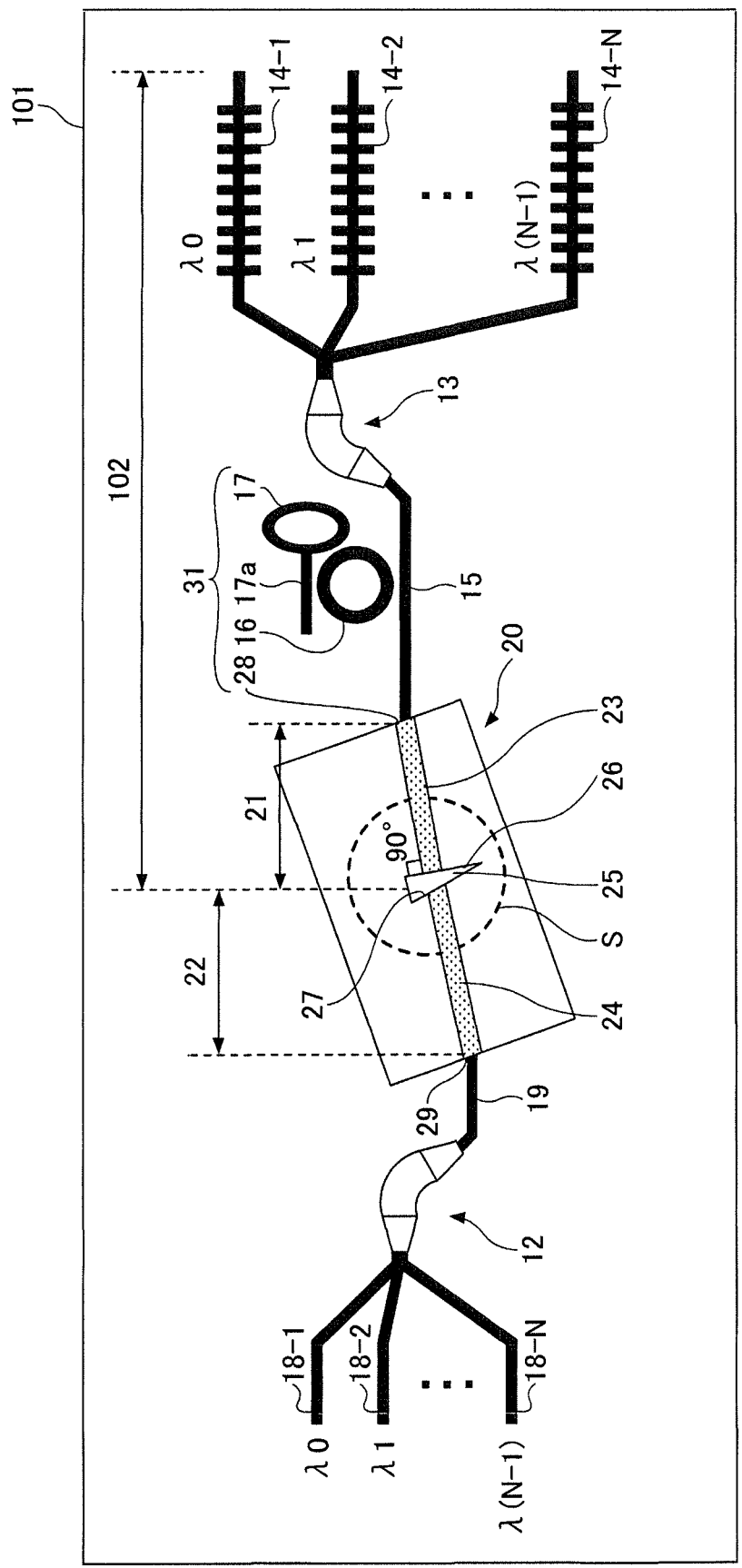
FIG. 6 is a schematic diagram of a multi-wavelength light source according to a third embodiment.

FIG. 6 is a schematic diagram of the multi-wavelength light source 1C according to the third embodiment. Although FIG. 6 is depicted based upon the configuration of the second embodiment, the configuration of the third embodiment may be based upon that of the first embodiment. The same components as those in the first embodiment and the second embodiment are denoted by the same reference numerals, and redundant description will be omitted.

In the third embodiment, undesired influence of reflected light is reduced at optical coupling points between the gain waveguide 23 of the gain chip 21 and the optical waveguide 15 and between the gain waveguide 24 of the booster SOA 22 and the optical waveguide 19, in addition to the separating section S.

The gain waveguides 23 of the gain chip 21 extends obliquely with respect to the end facet 28 of the substrate 20. The gain waveguide 24 of the booster SOA 22 extends obliquely with respect to the opposite end facet 29 of the substrate 20.

The gain waveguide 23 extends perpendicularly to the end facet 26 that faces the separation groove 25. The light propagating through the gain waveguide 23 is reflected from the end facet 26 that serves as an etched mirror and returns toward the waveguide 15. If the return light is reflected again from the end facet of the optical waveguide 15, the light will re-enter the gain waveguide 23 and the laser resonance will change. To avoid this, the gain waveguide 23 is formed obliquely with respect to the end facet 28 that is optically coupled to the optical waveguide 15. This configuration can prevent the light from being reflected at the end facet of the optical waveguide 15 and re-entering the gain waveguide 23.

Similarly, in the booster SOA 22, if the light emitted from the gain waveguide 24 is reflected from the optical waveguide 19 and re-enters the gain waveguide 24, undesirable resonance occurs in the optical amplifier. By forming the gain waveguide 24 obliquely with respect to the end facet 29 of the substrate 20, the amplified light is prevented from being reflected from the optical waveguide 19 and re-entering the gain waveguide 24.

In mounting the substrate 20 onto the substrate 101 of a silicon photonics wafer, influence of reflection of light at the coupling points to the optical waveguide 15 and the optical waveguide 19 is reduced. In order to reduce the re-incidence of light reflected from the optical coupling points, the substrate 20 in which the gain chip 21 and the booster SOA 22 are fabricated may be placed obliquely with respect to the long axis of the substrate 101.

In the example of FIG. 6, the end facet 28 of the gain chip 21 adjacent to the optical waveguide 15 is tilted at a predetermined angle from a plane perpendicular to the optical axis of the optical waveguide 15. The end facet 29 that becomes the output surface of the booster SOA 22 is also tilted at a predetermined angle from a plane perpendicular to the optical axis of the optical waveguide 19.

With the configuration of FIG. 6, the light reflected at the optically coupled point between the optical waveguide 15 and the gain waveguide 23 is prevented from re-entering the gain medium. Consequently, laser oscillation is maintained in the laser region 102. Furthermore, the end facet 29 of the gain waveguide 24 located at the output side of the booster SOS 22 is tilted with respect to the end facet of the optical waveguide 19 at an angle that enables to prevent the return light from the end facet of the optical waveguide 19 from re-entering the booster SOS 22. Thus, influence of the reflection is reduced.

The configuration of FIG. 6 is applicable to that of the first embodiment. In that application, the influence of reflection at the optically coupled point between the optical waveguide 15 and the gain waveguide 23 and the optically coupled point between the optical waveguide 19 and the gain waveguide 24 is reduced.

In the third embodiment, a multi-wavelength laser beam can be extracted precisely, using a single laser gain medium. A compact, low-power-consumption, and high-precision multi-wavelength light source can be achieved, while preventing the throughput yield from decreasing due to manufacturing variations of LDs.

Fourth Embodiment

Figure 7:
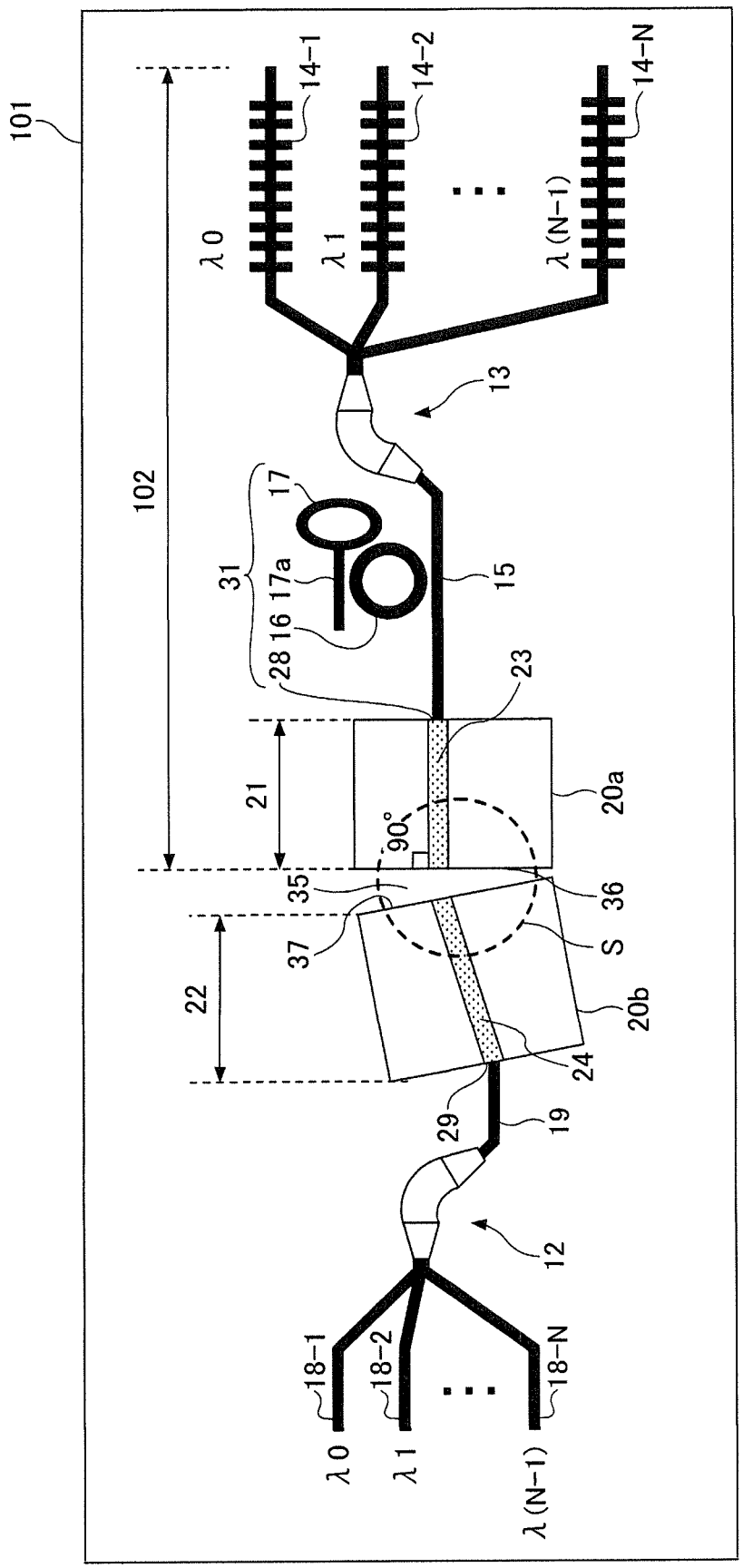
FIG. 7 is a schematic diagram of a multi-wavelength light source according to a fourth embodiment.

FIG. 7 is a schematic diagram of a multi-wavelength light source 10D according to the fourth embodiment. In the first to third embodiments, the gain chip 21 and the booster SOA 22 are formed in the same substrate 20, and these two optical components are separated by the separation groove 25 in the separating section S.

In the fourth embodiment, the gain chip 21 and the booster SOA 22 are formed on individual substrates 20a and 20b, and they are mounted on the substrate 101, e.g., a silicon photonics wafer. The gain chip 21 and the booster SOA 22 are placed such that the emission-side end facet 36 of the gain chip 21 and the incident-side end facet 37 of the booster SOA 22 make a certain angle. The end facet 36 is formed, for example, making use of cleavage, and it becomes a reflective surface. A resonator, namely, a laser region 102 is formed between the end facet 36 of the gain chip 21 and the diffraction gratings 14-1 to 14-N. Laser oscillations occur at the wavelengths determined by the diffraction gratings 14-1 to 14-N.

A groove or a recess for accommodating the gain chip 21 and the booster SOA 22 may be formed in advance in the substrate 101 of a silicon photonics wafer. The gain chip 21 and the booster SOA 22 are placed in the groove with the positional relationship illustrated in FIG. 7. In the groove, a space 35 is formed between the gain chip 21 and the booster SOA 22. The height positions of the gain waveguide 23 of the gain chip 21, the gain waveguide 24 of the booster SOA 22, and the optical waveguides 15 and 19 formed in the substrate 101 are all aligned.

The end facet 36 located at the light output side of the gain waveguide 23 of the gain chip 21 is orthogonal to the optical axis of the gain waveguide 23. On the other hand, the end facet 37 located at the incident side of the gain waveguide 24 of the booster SOA 22 is tilted from the optical axis of the beam emitted from the gain waveguide 23. A multi-wavelength laser beam is incident on the booster SOA 22 through the same optical path as that illustrated in FIG. 3. The light reflected from the incident-side end facet 37 of the booster SOA 22 is prevented from re-entering the gain chip 21.

The configuration of FIG. 7 is advantageous because the process for forming the separation groove 25 in the substrate 20 by dry etching can be omitted, and because the gain chip 21 can be acquired by cleavage-cutting.

As in the first to third embodiments, a multi-wavelength laser beam can be output using a single laser gain medium. The configuration of FIG. 7 may be applied to the configuration of the first embodiment.

Fifth Embodiment

Figure 8:
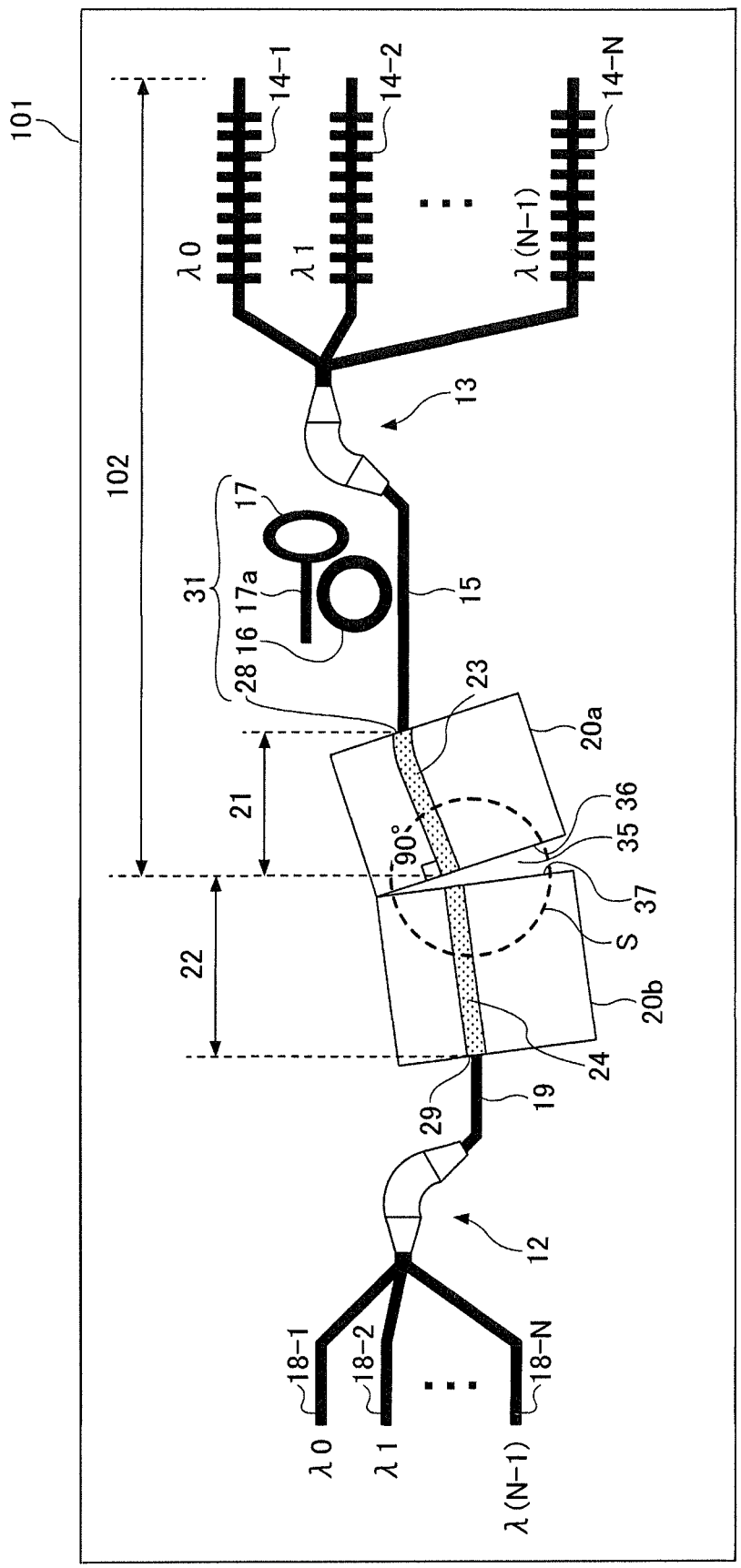
FIG. 8 is a schematic diagram of a multi-wavelength light source according to a fifth embodiment.

FIG. 8 is a schematic diagram of a multi-wavelength light source 10E according to the fifth embodiment. In this embodiment, the configuration of FIG. 6 (of the third embodiment) is achieved by a gain chip 21 and a booster SOA 22 formed on individual substrates 20a and 20b. Similar to the third embodiment, at an optically coupled position, waveguides extend obliquely with respect to each other and are connected at an angle deviating from a straight configuration.

The end facet 36 located at the laser output side of the gain chip 21 and the end facet 37 located at the incident side of the booster SOA 22 are positioned so as to make an angle between them, and a space 35 or an air layer is provided between the end facet 36 and the end facet 37. The height positions of the gain waveguide 23 of the gain chip 21, the gain waveguide 24 of the booster SOA 22, and the optical waveguides 15 and 19 of the substrate 101 are all aligned.

The gain waveguide 23 of the gain chip 21 extends perpendicular to the end facet 36 that serves as the output end, but it extends obliquely with respect to the opposite end facet 28. At the coupling point between the gain waveguide 23 and the optical waveguide 15, a light component reflected from the end facet of the optical waveguide 15 is prevented from re-entering the gain waveguide 23. Besides, a resonator 31 is provided inside the laser region 102. The spacing of the wavelengths to be multiplexed is fixed to the FSR of the resonator 31, and stable laser oscillation is achieved.

The incident-side end facet 37 of the gain waveguide 24 of the booster SOA 22 is tilted from a plane perpendicular to the optical axis of the laser beam output from the gain waveguide 23. This configuration prevents a light component reflected from the booster SOA 22 from re-entering the gain chip 21. The booster SOA 22 is also positioned such that its gain waveguide 24 is tilted from the optical axis of the optical waveguide 19 to prevent a light component reflected from the end facet of the optical waveguide 19 from returning back to the gain waveguide 24.

With this configuration, undesirable reflection is reduced at optically coupled positions, and malfunction of the multi-wavelength light source 10E can be prevented. The configuration of FIG. 8 may be applied to the configuration of FIG. 1.

In any of the first to fifth embodiments, a single gain chip 21 is used. One end facet of the gain chip 21 facing the booster SOA 22 is a reflective surface, and the opposite end facet of the gain chip 21 is optically connected via an optical multiplexer/demultiplexer to a plurality of diffraction gratings to generate a multi-wavelength laser beam. This configuration can realize a compact multi-wavelength light source with less power consumption, while preventing decrease of the throughput yield.

From the viewpoint of compensating for optical loss that may arise in the subsequent stage of the multi-wavelength light source, it is desirable to amplify the laser light containing multiple wavelengths in advance. Optical loss may arise during processes of multiplexing (combining) and demultiplexing (splitting) of light components when modulating the laser beam and generating optical signals for WDM transmission. In such a case, a sufficient level of light intensity may not be acquired for transmission. By amplifying the laser beam containing multiple wavelengths collectively or at once with the booster SOA 22, optical loss that may arise in the subsequent stage including optical modulation or light multiplexing/demultiplexing is compensated for in advance.

When a resonator 31 with an FSR equal to the wavelength spacing of the diffraction gratings 14-1 to 14-N is provided inside the laser region 102, as in the second and the subsequent embodiments, the wavelength spacing of the multiplexed light is determined by the FSR and is controlled precisely.

The chip layout of any of the third to fifth embodiments can be applied to the configuration of the silicon photonics optical waveguide of the first embodiment. In such applications, a single gain chip 21, a single booster SOA, and a resonance structure for producing multiple wavelengths are integrated on the substrate 101. The total amount of electric current injected for laser oscillation is reduced, and power consumption is reduced. Because it is unnecessary to form a diffraction grating in the gain medium of a compound semiconductor, the problem of the throughput yield of LDs is solved, and a multi-wavelength light source capable of generating designed wavelengths can be achieved.

<Applications to Optical Module>

Figure 9:
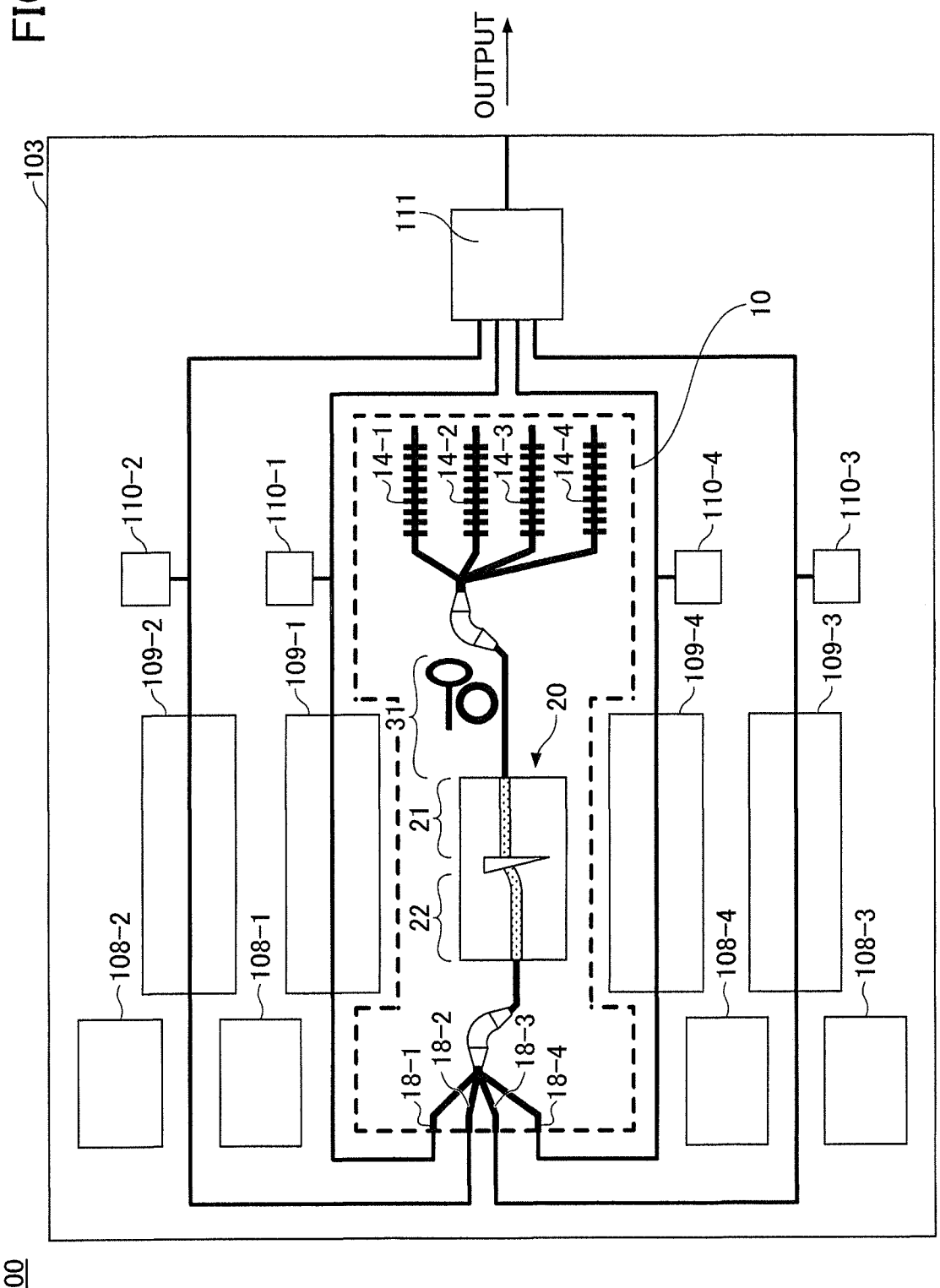
FIG. 9 is a schematic block diagram of an optical module using the multi-wavelength light source of an embodiment.

FIG. 9 is a schematic block diagram of an optical module 100 using a multi-wavelength light source 10 of an embodiment. The optical module 100 is, for example, a 4-channel WDM optical transmitter module.

The optical module 100 has a multi-wavelength light source 10, optical modulators 109-1 to 109-4, modulator drivers 108-1 to 108-4, and an optical multiplexer 111 on a substrate 103. Monitor PDs 110-1 to 110-4 may be provided on the substrate 103 to monitor the output lights of the optical modulators 109-1 to 109-4.

The multi-wavelength light source 10 is indicated as a region surrounded by the dashed line in the figure for the purpose of facilitating understanding the structure. In reality, the optical waveguides (indicated by thick lines) formed in the multi-wavelength light source 10 and optical waveguides formed on the substrate 103 of the optical module 100 are formed simultaneously in the same process.

Although in FIG. 9 the configuration of the second embodiment (see FIG. 4) is used as the multi-wavelength light source 10, any configuration of the first to fifth embodiments may be employed. The multi-wavelength light source 10 generates four different wavelengths by laser oscillations using a single gain chip 21 with the end facet 26 (see FIG. 4) serving as the reflective surface and four diffraction gratings 14-1 to 14-4.

A resonator 31 having an FSR the same as the target wavelength spacing may be provided between the gain chip 21 and the optical multiplexer/demultiplexer 13 (see FIG. 4) that demultiplexes light into wavelength components of diffraction gratings 14-1 to 14-4. In this case, the oscillation wavelengths can be controlled at equal intervals by the FSR.

The laser beam output from the gain chip 21 and containing four different wavelengths is amplified at a time by the booster SOA 22, then demultiplexed and output from the output waveguides 18-1 to 18-4.

The lights of the respective wavelengths are incident on the associated optical modulators 109-1 to 109-4 (which may be referred to collectively as "optical modulators 109"). In each of the optical modulators 109, the light beam with the corresponding wavelength is modulated by high-frequency drive signals input from the associated modulator driver 108. The modulated lights are output as optical signals from the optical modulators 109. The modulated optical signals of the respective wavelengths are multiplexed by the optical multiplexer 111 and output to the optical transmission path.

The multi-wavelength light source 10 used in the optical module 100 has a single laser gain medium mounted, and the entirety of the optical module 100 is made compact and power consumption can be reduced. Because the laser gain medium and the optical amplifier are formed on the same chip, the space required for placing these two optical components can be reduced, and optical loss that may occur in the subsequent stage can be compensated for in advance. With the resonators 31 having a predetermined FSR, the spacing of the wavelengths to be multiplexed can be controlled to that determined by the FSR, and the reliability of the WDM telecommunication can be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiments of the present inventions have been described in detail, it should be understood that the various changes, substitutions, and alterations could be made hereto without departing from the spirit and scope of the invention.

What is claimed is:

1. A multi-wavelength light source comprising:
    a laser region that includes a gain medium with a reflective end facet, and two or more diffraction gratings optically connected to a second end facet opposite to the reflective end facet of the gain medium;
    an optical amplifier configured to amplify a laser beam emitted from the reflecting end facet of the laser region and containing multiple wavelengths, the multiple wavelengths being amplified collectively;
    an optical demultiplexer configured to demultiplex an amplified laser beam output from the optical amplifier; and
    output waveguides connected to the optical demultiplexer and configured to output light beams with the multiple wavelengths.

2. The multi-wavelength light source as claimed in claim 1, wherein the laser gain medium and the optical amplifier are fabricated in a same substrate and separated from each other by a separation groove.

3. The multi-wavelength light source as claimed in claim 2,
    wherein the separation groove has a first facet that becomes the reflective end facet of the laser gain medium, and a second facet that becomes an incident end facet of the optical amplifier, and
    wherein the first facet and the second facet are tilted from each other at a predetermined angle.

4. The multi-wavelength light source as claimed in claim 3, wherein the first facet and the second facet are etched mirrors.

5. The multi-wavelength light source as claimed in claim 2, wherein the separation groove has a wedge-shaped planar view.

6. The multi-wavelength light source as claimed in claim 1,
    wherein the laser gain medium is formed in a first substrate, and the optical amplifier is formed in a second substrate different from the first substrate, and
    wherein the first substrate and the second substrate are provided in a same plane, making a predetermined angle between them.

7. The multi-wavelength light source as claimed in claim 6,
    wherein the first substrate has the reflective end facet and the second substrate has an incident end facet on which the laser beam is incident, and
    wherein a space is provided between the reflective end facet of the first substrate and the incident end facet of the second substrate.

8. The multi-wavelength light source as claimed in claim 1,
    wherein an optical axis of a gain waveguide of the laser gain medium is perpendicular to the reflective end facet, and
    wherein an incident end facet of a gain waveguide of the optical amplifier is tilted with respect to the laser beam emitted from the laser gain medium.

9. The multi-wavelength light source as claimed in claim 1, wherein a gain waveguide of the laser gain medium extends obliquely with respect to the second facet.

10. The multi-wavelength light source as claimed in claim 1, wherein a gain waveguide of the optical amplifier extends obliquely with respect to an incident facet of the optical amplifier.

11. The multi-wavelength light source as claimed in claim 1, further comprising:
    a resonator provided between the laser gain medium and the two or more diffraction gratings and having a free spectral range equal to a spacing of the multiple wavelengths.

12. The multi-wavelength light source as claimed in claim 11,
    wherein the resonator has a ring waveguide and a loop mirror, and
    wherein the resonator is formed between the second facet of the laser gain medium and the loop mirror.

13. The multi-wavelength light source as claimed in claim 1, further comprising:
    a first optical waveguide optically connected to the second facet of the laser gain medium,
    a second optical waveguide optically connected to an output facet of the optical amplifier,
    wherein an optical axis of a gain waveguide of the laser gain medium is tilted from an optical axis of the first optical waveguide, or an optical axis of a gain waveguide of the optical amplifier is tilted from an optical axis of the second optical waveguide.

14. The multi-wavelength light source as claimed in claim 1, further comprising:
    an optical multiplexer/demultiplexer provided between the laser gain medium and the two or more diffraction gratings and configured to demultiplex a light generated in the laser gain medium,
    wherein each of the multiple wavelengths demultiplexed by the multiplexer/demultiplexer is provided to an associated diffraction grating of the two or more diffraction gratings.

15. The multi-wavelength light source as claimed in claim 14, further comprising:
    a resonator provided between the laser gain medium and the optical multiplexer/demultiplexer and having a free spectral range equal to a spacing of the multiple wavelengths.

16. The multi-wavelength light source as claimed in claim 1, wherein the light beams with the multiple wavelengths output from the output waveguides are continuous laser beams.

17. An optical module comprising:
a multi-wavelength light source that has
- a laser region that includes a gain medium with a reflective end facet, and two or more diffraction gratings optically connected to a second end facet opposite to the reflective end facet of the gain medium,
- an optical amplifier configured to amplify at once a laser beam emitted from the reflecting end facet of the laser region and containing multiple wavelengths, the multiple wavelengths being amplified collectively,
- an optical demultiplexer configured to demultiplex an amplified laser beam output from the optical amplifier, and
- output waveguides connected to the optical demultiplexer and configured to output light beams with the multiple wavelengths; and optical modulators, each provided corresponding to an associated wavelength of the multiple wavelengths; and a multiplexer configured to multiplex modulated optical signals output from the optical modulators.

* * * * *